United States Patent
Huh et al.

(10) Patent No.: US 11,232,931 B2
(45) Date of Patent: Jan. 25, 2022

(54) INTERMODULATION DISTORTION MITIGATION USING ELECTRONIC VARIABLE CAPACITOR

(71) Applicant: MKS Instruments, Inc., Andover, MA (US)

(72) Inventors: Jin Huh, Daejeon (KR); Aaron T. Radomski, Conesus, NY (US); Duy Nguyen, Daejeon (KR); Soohan Kim, Daejeon (KR)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 17/073,709

(22) Filed: Oct. 19, 2020

(65) Prior Publication Data

US 2021/0118649 A1 Apr. 22, 2021

Related U.S. Application Data

(60) Provisional application No. 62/923,959, filed on Oct. 21, 2019.

(51) Int. Cl.
*H01J 37/32* (2006.01)
*H05H 1/46* (2006.01)

(52) U.S. Cl.
CPC ......... *H01J 37/32183* (2013.01); *H05H 1/46* (2013.01); *H05H 2242/20* (2021.05)

(58) Field of Classification Search
None
See application file for complete search history.

(56) References Cited

U.S. PATENT DOCUMENTS

| 5,473,291 A | 12/1995 | Brounley |
| 7,602,127 B2 | 10/2009 | Coumou |

(Continued)

FOREIGN PATENT DOCUMENTS

| TW | 201709774 A | 3/2017 |
| TW | 201719711 A | 6/2017 |

(Continued)

OTHER PUBLICATIONS

International Search Report and Written Opinion issued for Application No. PCT/US2020/056512 dated Feb. 10, 2021.

(Continued)

*Primary Examiner* — Jany Richardson
(74) *Attorney, Agent, or Firm* — Harness, Dickey & Pierce, P.L.C.

(57) ABSTRACT

A matching network for a system having a non-linear load and powered by a first RF power supply operating at a first frequency and a second RF power supply operating at a second frequency. The matching network includes a first matching network section for providing an impedance match between the first power supply and the load. The matching network also includes a second matching network section for providing an impedance match between the second power supply and the load. A the first matching network section includes a first variable reactance, and the variable reactance is controlled in accordance with IMD sensed in the signal applied to the load by the first RF power supply. The variable reactance is adjusted in accordance with the IMD to reduce the detected IMD.

23 Claims, 10 Drawing Sheets

(56) References Cited

U.S. PATENT DOCUMENTS

| | | |
|---|---|---|
| 8,110,991 B2 | 2/2012 | Coumou |
| 8,395,322 B2 | 3/2013 | Coumou |
| 8,952,765 B2 | 2/2015 | Fisk, II et al. |
| 9,947,514 B2 | 4/2018 | Radomski et al. |
| 10,049,357 B2 | 8/2018 | Kapur et al. |
| 10,217,609 B2 | 2/2019 | Fisk, II et al. |
| 10,229,816 B2 | 3/2019 | Coumou et al. |
| 10,264,662 B2 | 4/2019 | Iwata et al. |
| 10,304,669 B1 | 5/2019 | Coumou et al. |
| 10,546,724 B2 | 1/2020 | Radomski et al. |
| 10,720,305 B2 | 7/2020 | Van Zyl |
| 10,821,542 B2 | 11/2020 | Nelson et al. |
| 2014/0320013 A1 | 10/2014 | Coumou et al. |
| 2017/0062186 A1* | 3/2017 | Coumou ........... H01J 37/32165 |
| 2017/0288736 A1 | 10/2017 | Zhou et al. |
| 2019/0108976 A1 | 4/2019 | Van Zyl |
| 2021/0159051 A1* | 5/2021 | Taniguchi ......... H01J 37/32183 |

FOREIGN PATENT DOCUMENTS

| | | |
|---|---|---|
| WO | WO-2010102125 A2 | 9/2010 |
| WO | WO-2014143215 A1 | 9/2014 |
| WO | WO-2017034632 A1 | 3/2017 |

OTHER PUBLICATIONS

Coumou, David J. "Ion Energy Distribution Skew Control Using Phase Lock Harmonic RF Bias Drive", IEEE Trans. on Plasma Science, 2014.

Office Action regarding Taiwanese Application No. 109136541, dated Aug. 30, 2021.

* cited by examiner

INTERMODULATION DISTORTION MITIGATION USING ELECTRONIC VARIABLE CAPACITOR

CROSS-REFERENCE TO RELATED APPLICATIONS

This application claims the benefit of U.S. Provisional Application No. 62/923,959, filed on Oct. 21, 2019. The entire disclosure of the above application is incorporated herein by reference.

FIELD

The present disclosure relates to improving operation of power supply systems driving non-linear loads and to improving operation of power supply system response to reflected intermodulation distortion (IMD).

BACKGROUND

Plasma fabrication is frequently used in semiconductor fabrication. In plasma fabrication etching, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A matching network includes a first variable reactance section. The first variable reactance section is configured for adjustment in response to the impedance between the matching network and a load. The first variable reactance section adjusts the impedance between a first RF power source generating a first RF signal operating at a first frequency. The matching network includes a second variable reactance section. the second variable reactance section is configured for adjustment in response to the impedance between the matching network and the load. The second variable reactance section adjusts the impedance between a second RF power source generating a second RF signal operating at a second frequency. The matching network includes a third variable reactance section. The third variable reactance section is configured for adjustment in response to reflected intermodulation distortion (IMD) generated by interaction between the first RF signal and the second RF signal. Adjustment of the third variable reactance section reduces the reflected IMD.

A matching network also includes a first reactance section configured to provide a first reactance to control an impedance between a first RF power source generating a first RF signal operating at a first frequency and a load. The matching network also includes a second variable reactance section configured to adjust a second reactance to control impedance in response to intermodulation distortion (IMD) from interaction between the first RF signal and a second RF signal on the impedance.

A radio frequency (RF) power supply includes a RF power source. The RF power supply also includes a matching network between the RF power source and a load. The matching network includes a first reactance section configured to provide a first reactance to control an impedance between a first RF power source generating a first RF signal operating at a first frequency and the load. The first reactance is one of fixed or variable. A second variable reactance section is configured to adjust a second reactance to introduce a reactance offset to control impedance in response to intermodulation distortion (IMD) from interaction between the first RF signal and a second RF signal operating at a second frequency on the impedance. The radio frequency system also includes a controller configured to communicate with the second variable reactance section and configured to generate a control signal to adjust the second reactance in response to a trigger signal to control the impedance. The reactance offset varies in accordance with the second RF signal.

A method for reducing impedance mismatch includes providing a first reactance to control an impedance between a first RF power source generating a first RF signal operating at a first frequency and a load. The method also includes providing a second variable reactance to adjust a second reactance to control impedance in response to intermodulation distortion (IMD) from interaction between the first RF signal and a second RF signal on the impedance.

A non-transitory computer-readable medium storing instructions including detecting a trigger signal. The instructions further include in response to the trigger signal, adjusting a variable reactance to control an impedance between a first RF power source and a load that varies in accordance with intermodulation distortion (IMD) from interaction between a first RF signal output by the first RF power source and a second RF signal.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

The present disclosure will become more fully understood from the detailed description and the accompanying drawings.

In the drawings, reference numbers may be reused to identify similar and/or identical elements.

DETAILED DESCRIPTION

Figure 1:
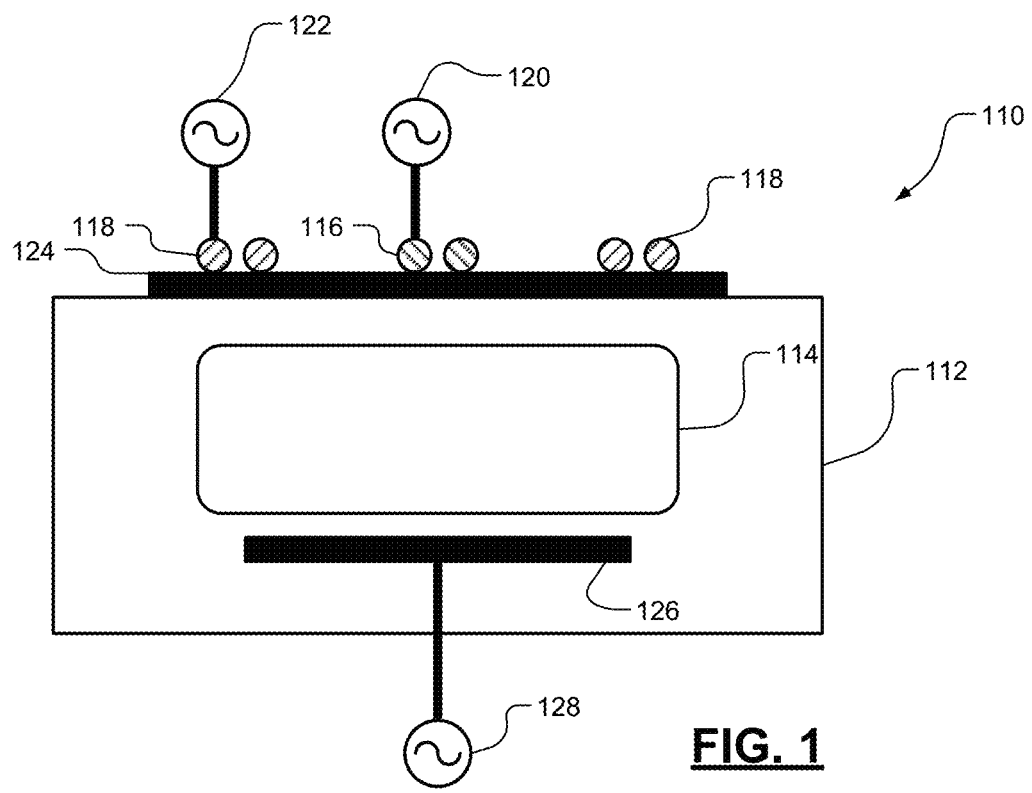
FIG. 1 depicts a representation of an inductively coupled plasma system.

A power system may include a DC or RF power generator, a matching network, and a load (such as a non-linear load, a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing an RF signal, rather than applying a continuous RF signal to the load. In a pulse mode of operation, the RF signal is modulated by a modulation signal in order to define an envelope for the modulated power signal. The RF signal may be, for example, a sinusoidal RF signal or other time varying signal. Power delivered to the load is typically varied by varying the modulation signal. The modulation signal may have any number of shapes, including a square wave, a square wave with multiple states of different amplitudes, or other waveform having one or multiple states or portions.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include a bias power and/or a source power applied to one or a plurality of electrodes of the load. The source power typically generates a plasma and controls plasma density, and the bias power modulates ions in the formulation of a sheath that contains the plasma. The bias and the source may share the same electrode or may use separate electrodes, in accordance with various design considerations.

When a power delivery system drives a time-varying or non-linear load, such as a process chamber, plasma chamber, or reactor, the power absorbed by the plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by frequency and phase. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present invention and incorporated by reference in their entirety in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991;

and 8,395,322, referenced above. The dual power system described in the above-referenced patents requires a closed-loop control system to adapt power supply operation for the purpose of controlling ion density and its corresponding IEDF.

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference in its entirety in this application, describes a method of pulse synchronization by monitoring power in another frequency band. In the referenced U.S. patent, the pulsing of a second RF generator is controlled in accordance with detecting at the second RF generator the pulsing of a first RF generator, thereby synchronizing pulsing between the two RF generators.

FIG. 1 depicts an exemplary representation of an inductively coupled plasma (ICP) system 110. ICP system 110 includes a non-linear load, such as a reactor, plasma reactor, or plasma chamber 112, which will be referred to interchangeably herein, for generating plasma 114. Power in the form of voltage or current is applied to plasma chamber 112 via a pair of coils, including a coil assembly that in various embodiments includes an inner coil 116 and an outer coil 118. Power is applied to inner coil 116 via a RF power generator or power source 120, and power is applied to outer coil 118 via RF power generator or power source 122. Coils 116 and 118 are mounted to dielectric window 124 that assists in coupling power to plasma chamber 112. A substrate 126 is placed in plasma chamber 112 and typically forms the work piece that is the subject of plasma operations. An RF power generator, power supply, or power source 128 (the terms may be used herein interchangeably) applies power to plasma chamber 112 via substrate 126. In various configurations, the power sources 120, 122 provide a source voltage or current to ignite or generate plasma 114 or control the plasma density. Also in various configurations, power source 128 provides a bias voltage or current that modulates the ions to control the ion energy or ion density of the plasma 114. In various embodiments, power sources 120, 122 are locked to operate at the same frequency, voltage, and current, with fixed or varying relative phases. In various other embodiments, power sources 120, 122 may operate at different frequencies, voltages, and currents, and relative phases.

Figure 2:
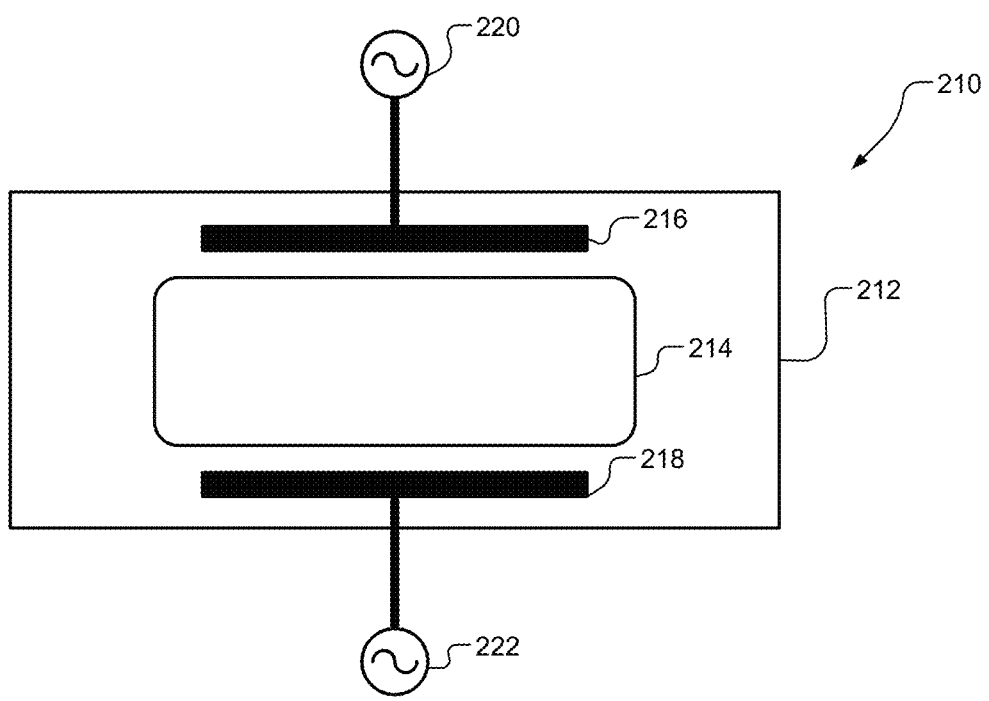
FIG. 2 depicts a representation of a capacitively coupled plasma system.

FIG. 2 depicts an exemplary representation of a capacitively coupled plasma (CCP) system 210. CCP system 210 includes a plasma chamber 212 for generating plasma 214. A pair of electrodes 216, 218 placed within plasma chamber 212 connect to respective DC ($\omega=0$) or RF power generators or power sources 220, 222. In various embodiments, power source 220 provides a source voltage or current to ignite or generate plasma 214 or control the plasma density. In various embodiments, power source 222 provides a bias voltage or current that modulates the ions in the plasma to control the ion energy and/or ion density of the plasma 214. In various RF embodiments, power sources 220, 222 operate at relative phases when the sources are harmonically related. In various other embodiments, power sources 220, 222 operate at different frequencies, voltages, and currents, with fixed or varying relative phases. Also in various embodiments, power sources 220, 222 can be connected to the same electrode, while the counter electrode is connected to ground or to yet a third DC ($\omega=0$) or RF power generator (not shown).

Figure 3:
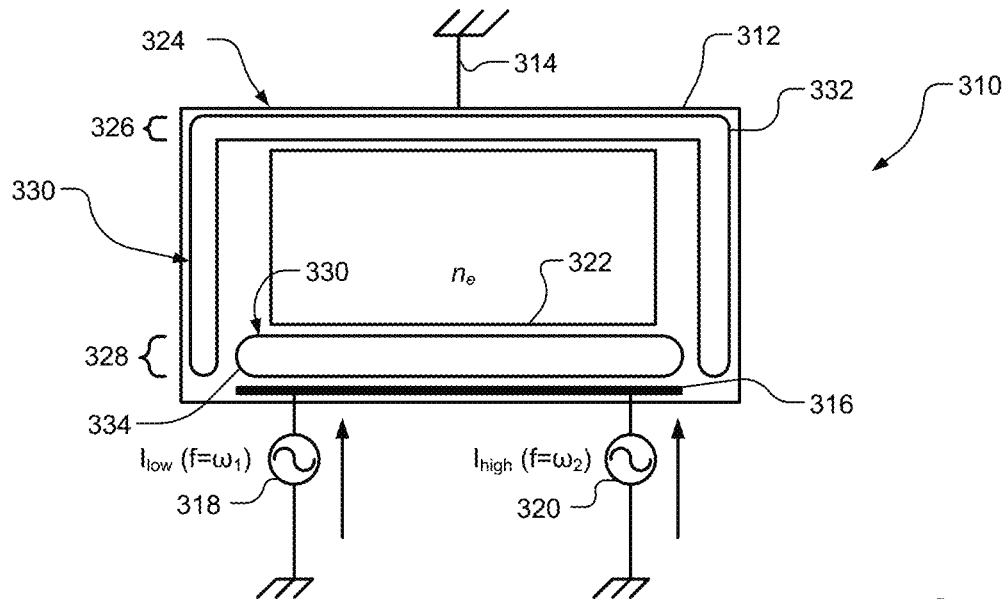
FIG. 3 depicts a generalized representation of a plasma system arranged according to various embodiments of the present disclosure.

FIG. 3 depicts a cross-sectional view of a generalized representation of a dual power input plasma system 310. Plasma system 310 includes first electrode 312 connected to ground 314 and second electrode 316 spaced apart from first electrode 312. A first DC ($\omega=0$) or RF power source 318 generates a first RF power applied to second electrode 316 at a first frequency f=$\omega_1$. A second power source 320 generates a second DC ($\omega=0$) or RF power applied to second electrode 316. In various embodiments, second power source 320 operates at a second frequency f=$\omega_2$, where $\omega_2$=n$\omega$ that is the n$^{th}$ harmonic frequency of the frequency of first power source 318. In various other embodiments, second power source 320 operates at a frequency (that is not a multiple of the frequency of the first power source 318).

Coordinated operation of respective power supplies 318, 320 results in generation and control of plasma 322. As shown in FIG. 3 in schematic view, plasma 322 is formed within an asymmetric sheath 330 of plasma chamber 324. Sheath 330 includes a ground sheath 332 and a powered sheath 334. The sheath is generally described as the surface area surrounding plasma 322. As can be seen in schematic view in FIG. 3, grounded sheath 332 has a relatively large surface area 326. Powered sheath 334 was a small surface area 328. Because each sheath 332, 334 functions as a dielectric between the conductive plasma 322 and respective electrodes 312, 316, each sheath 332, 334 forms a capacitance between plasma 322 and respective electrodes 312, 316. As will be described in greater detail herein, in systems in which a high frequency voltage source, such as second power source 320, and a low frequency voltage source, such as first power source 318, intermodulation distortion (IMD) products are introduced. IMD products result from a change in plasma sheath thickness, thereby varying the capacitance between plasma 322 and electrode 312, via grounded sheath 334, and plasma 322 and electrode 316, via powered sheath 334. The variation in the capacitance of powered sheath 330 generates IMD. Variation in powered sheath 334 has a greater impact on the capacitance between plasma 322 and electrode 316 and, therefore, on the reverse IMD emitted from plasma chamber 324. In some plasma systems grounded sheath 332 acts as a short circuit and is not considered for its impact on reverse IMD.

Figure 4:
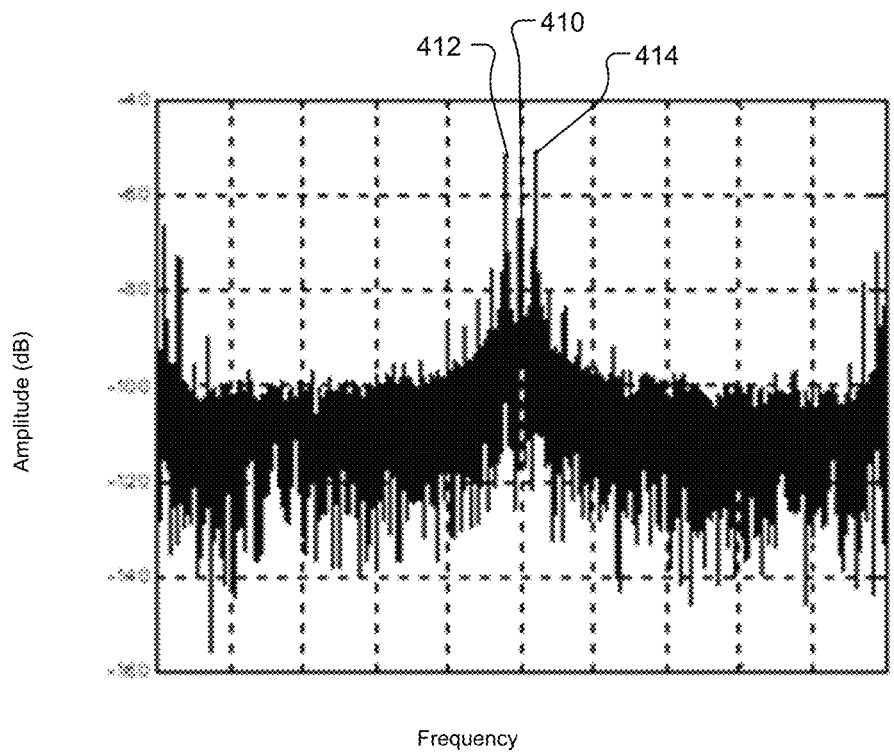
FIG. 4 is an example plot of intermodulation distortion (IMD) resulting from applying two signals of different frequency to a non-linear reactor.

FIG. 4 depicts a plot of amplitude versus frequency for an exemplary power delivery system having a low frequency source such as first power source 318, and a high frequency source, such as second power source 320. FIG. 4 depicts the reflected power with respect to the frequency. FIG. 4 includes a center peak 410 indicating the center frequency of operation of the high frequency power source, such as second power source 320 of FIG. 3. On either side of generator peak 410, FIG. 4 also depicts peaks 412, 414 which represent the IMD components introduced by the application of power from a low frequency power source, such as first power source 318 of FIG. 3. By way of non-limiting example, if second power source 320 operates at a frequency of 60 MHz, and low frequency power source 318 operates at 400 kHz, IMD components can be found at 60 MHz+/−n*400 kHz, where n is any integer. Thus, peaks 412, 414 represent the high frequency+/−the low frequency of the respective power supplies. Driving an electrode at multiple harmonics, such as shown in FIG. 3, provides the opportunity to control DC self-bias electrically and to tailor the energetic levels of ion density.

Application of the respective first and second powers to second electrode 316 of FIG. 3 generates plasma 322 having an electron density $n_e$. Within the plasma 322, the sheath layer which has a greater density of positive ions, and, thus, an overall-excess positive charge that balances an opposite negative charge on the surface of a material (not shown) within the plasma with which it is in contact. Determining the position of the sheath is relevant to the plasma processing operation. The sheath thickness as a function of time is shown in equation (1):

$$s(t) = \Sigma s_n (1 - \sin(\omega_n t + \phi_{n-1})) \quad (1)$$

where:

$\omega = 2\pi f$ is the lower frequency ($f = \omega_1$) of the dual frequency system; and $\phi$ is the relative phase between the frequencies.

The term $s_n$ is the amplitude of the sheath oscillation and is defined in equation (2):

$$s_n = \frac{I_n}{e \eta_e \omega_n A} \sqrt{n} \quad (2)$$

where:

$I_n$ is the drive current associated with $\omega_n$;
$n_e$ is the electron density;
A is the electrode discharge area; and
e is electron charge.

Equations (1) and (2) demonstrate that the thickness of the sheath varies in accordance with the relative phase between $\phi$, in the case of equation (1), and the applied power, $I_n$ in the case of equation (2). In terms of the IEDF, the applied power $I_n$ is sometimes referred to as the relative amplitude variable or width, and the relative phase $\phi$ is sometimes referred to as the relative phase variable or skew.

A useful property characterizing the sheath can be found with respect to the time dependent sheath voltage described below with respect to equation (3):

$$V_{bias}(t) = \frac{en_e}{2\varepsilon_o} s^2(t) \quad (3)$$

where:

$\varepsilon_o$ is the electron charge permittivity of free space, and
$e$, $n_e$, and $s^2(t)$ are as described above.

As can be seen from the above equations (1)-(3), the thickness of the sheath varies as a function of the frequency of the bias power supply. Since the surface area 328 of powered sheath 334 causes a change in capacitance between plasma 322 and electrode 316, variation of the sheath thickness in accordance with equation (1) causes a change in the sheath capacitance. A change in sheath capacitance causes corresponding IMD generated by the variation in sheath thickness of powered sheath 334 causes a corresponding impedance fluctuation. The corresponding impedance fluctuation interrupts the consistent delivery of forward power from the source power supply, such as second power source 320 of FIG. 3, since reverse power accompanies the IMD. As will be described in greater detail herein, by inserting a variable capacitance or reactance between the source power supply and an electrode of the plasma chamber and varying the capacitance or reactance in accordance with the frequency of the low frequency source or bias power supply, capacitance variation caused by the variation in sheath thickness can be counteracted by the proper tuning of the variable capacitor introduced between the source power supply, such as second power supply 320 of FIG. 3, and the electrode, such as electrode 316 of FIG. 3.

Conventional matching networks typically utilize vacuum variable capacitors (VVC) as the load and tune elements of the matching network and, thus, are not tailored to address the IMD described above. A typical VVC does not respond at a rate that is consistent with the operating frequency of the bias or second power supply. A typical matching network address an average of the reverse power that affect the impedance match and does not address specific IMD causing events. Reflected IMD at best becomes part of the measured average reverse or reflected power which is canceled.

One method of addressing IMD-induced impedance match disturbances includes an RF circulator. An RF circulator can be configured to absorb power reflected from the plasma to protect the power amplifier from the IMD-induced impedance match disturbances. An RF circulator appropriately sized to be effective with, for example, a 60 MHz frequency requires a significant physical volume and can be a costly solution. Further, when employing an RF circulator, power reflected from the plasma is dissipated in a dump resistor rather than the plasma, requiring a larger RF generator to meet a predetermined power requirement for operating the plasma. Circulators also require that power supply designers consider the impact of the mechanical and cooling requirements of the circulator the physical layout of the source or first power supply.

Another method of addressing IMD-induced impedance match disturbances includes monitoring the application of the RF signal from bias or second power supply to the load. By monitoring the application of the bias or second power supply RF signal to the load, the source or first power supply RF signal can be adjusted by applying a frequency offset synchronized to the RF signal output by the bias or second power supply. The frequency offset compensates for the anticipated IMD-induced impedance match disturbances, thereby reducing the reflected power. An example of such a system can be found with respect to U.S. Pat. No. 9,947,514, assigned to the assignee of the present invention and incorporated by reference in its entirety in this application. Such a system relies upon coordination between the bias RF power supply and the source RF power supply.

Another method of addressing IMD-induced impedance match disturbances includes introducing IMD cancelling frequency components into the RF signal output by the first or source RF power supply. An example of such a system can be found with respect to U.S. Pat. No. 10,304,669, issued May 28, 2019 (withdrawn U.S. Pat. No. 10,269,546), assigned to the assignee of the present invention and incorporated by reference in its entirety in this application. The IMD cancelling frequency components mitigate the IMD introduced by application of the RF signal output the second or bias RF power supply. The RF signal output by the source or first RF power supply includes a main or center frequency component and an IMD cancelling component. The respective components are summed and applied to the power amplifier of the source or first RF power supply. Summing the respective components requires a larger amplifier than may otherwise be necessary to meet the plasma operating components. Since the IMD cancelling component is cancelled by the IMD introduced by the RF signal output by the bias or second RF power supply, no power provided by the IMD cancelling component is added to the plasma.

Figure 5:
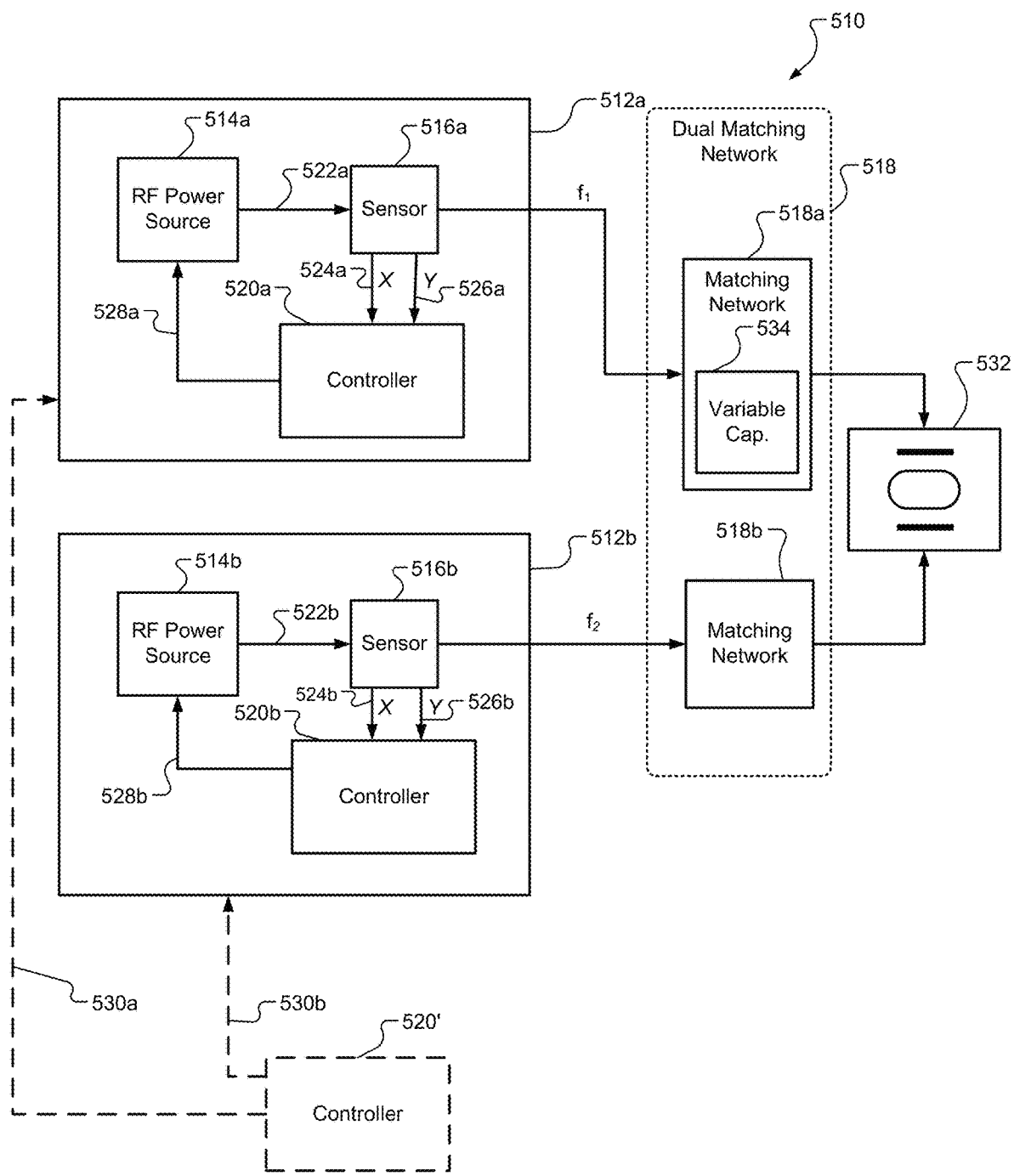
FIG. 5 is a schematic diagram of a power delivery system having multiple power supplies arranged according to various embodiments of the present disclosure.

FIG. 5 depicts a RF generator or power supply system 510. Power supply system 510 includes a pair of radio frequency (RF) generators or power supplies 512a, 512b, matching networks 518a, 518b, and load 532, such as a non-linear load, plasma chamber, process chamber, and the like. In various embodiments, RF generator 512a is referred to as a source RF generator or power supply, and matching network 518a is referred to as a source matching network. Also in various embodiments, RF generator 512b is referred to as a bias RF generator or power supply, and matching network 518b is referred to as a bias matching network. It will be understood that the components can be referenced individually or collectively using the reference number without a letter subscript or a prime symbol. The bias generator 512b may generate a sinusoidal waveform at frequency $f_2$, or a complex periodic waveform that contains $f_2$ and multiple harmonics of $f_2$.

RF generators 512a, 512b include respective RF power sources or amplifiers 514a, 514b, RF sensors 516a, 516b, and processors, controllers, or control modules 520a, 520b. RF power sources 514a, 514b generate respective RF power signals 522a, 522b output to respective sensors 516a, 516b. Sensors 516a, 516b receive the output of RF power sources 514a, 514b and generate respective RF power signals or RF power signals $f_1$ and $f_2$. Sensors 516a, 516b also output signals that vary in accordance with various parameters sensed from load 532. While sensors 516a, 516b, are shown within respective RF generators 512a, 512b, RF sensors 516a, 516b can be located externally to the RF power generators 512a, 512b. Such external sensing can occur at the output of the RF generator, at the input of an impedance matching device located between the RF generator and the load, or between the output of the impedance matching device (including within the impedance matching device) and the load.

Sensors 516a, 516b detect operating parameters of load 532 and output signals X and Y. Sensors 516a, 516b may include voltage, current, and/or directional coupler sensors. Sensors 516a, 516b may detect (i) voltage V and current I and/or (ii) forward power $P_{FWD}$ output from respective power amplifiers 514a, 514b and/or RF generators 512a, 512b and reverse or reflected power $P_{REV}$ received from respective matching networks 518a, 518b or load 532 connected to respective sensors 516a, 516b. The voltage V, current I, forward power $P_{FWD}$, and reverse power $P_{REV}$ may be scaled and/or filtered versions of the actual voltage, current, forward power, and reverse power associated with the respective power sources 514a, 514b. Sensors 516a, 516b may be analog and/or digital sensors. In a digital implementation, the sensors 516a, 516b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 516a, 516b generate sensor signals X, Y, which are received by respective controllers or power control modules 520a, 520b. Power control modules 520a, 520b process the respective X, Y signals 524a, 526a and 524b, 526b and generate one or a plurality of feedback control signals 528a, 528b to respective power sources 514a, 514b. Power sources 514a, 514b adjust the RF power signals 522a, 522b based on the received feedback control signal. In various embodiments, power control modules 520a, 520b may control matching networks 518a, 518b, respectively, via respective control signals. Power control modules 520a, 520b may include, at least, proportional integral derivative (PID) feedback controllers, adaptive feedforward controllers, or subsets thereof and/or direct digital synthesis (DDS) component(s) and/or any of the various components described below in connection with the modules.

In various embodiments, power control modules 520a, 520b are PID controllers or subsets thereof and may include functions, processes, processors, or submodules. Feedback control signals 528a, 528b may be drive signals and may include DC offset or rail voltage, voltage or current magnitude, frequency, and phase components. In various embodiments, feedback control signals 528a, 528b can be used as inputs to one or multiple control loops. In various embodiments, the multiple control loops can include a proportional-integral-derivative (PID) control loop for RF drive, and for rail voltage. In various embodiments, feedback control signals 528a, 528b can be used in a Multiple Input Multiple Output (MIMO) control scheme. An example of a MIMO control scheme can be found with reference to U.S. Pat. No. 10,546,724, issued Jan. 28, 2020 entitled Pulsed Bidirectional Radio Frequency Source/Load and assigned to the assignee of the present application, and incorporated by reference in its entirety in this application.

In various embodiments, power supply system 510 can include controller 520'. Controller 520' may be disposed externally to either or both of RF generators 512a, 512b and may be referred to as external or common controller 520'. In various embodiments, controller 520' may implement one or a plurality of functions, processes, or algorithms described herein with respect to one or both of controllers 520a, 520b. Accordingly, controller 520' communicates with respective RF generators 512a, 512b via a pair of respective links 530a, 530b which enable exchange of data and control signals, as appropriate, between controller 520' and respective RF generators 512a, 512b. In various embodiments, controllers 520a, 520b, 520' can distributively and cooperatively provide analysis and control along with RF generators 512a, 512b. In various other embodiments, controller 520' can provide control of RF generators 512a, 512b, eliminating the need for respective local controllers 520a, 520b.

In various embodiments, RF power source 514a, sensor 516a, controller 520a, and matching network 518a can be referred to as source RF power source 514a, source sensor 516a, source controller 520a, and source matching network 518a. Similarly, in various embodiments, RF power source 514b, sensor 516b, controller 520b, and matching network 518b can be referred to as bias RF power source 514b, bias sensor 516b, bias controller 520b, and bias matching network 518b. In various embodiments and as described above, the source term refers to the RF generator that generates a plasma, and the bias term refers to the RF generator that tunes the plasma Ion Energy Distribution Function (IEDF) relative to the bias RF power supply. In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

In various embodiments, matching network 518a and matching network 518b may operate as standalone matching networks. In various other embodiments, matching networks 518a, 518b may be configured to operate as a combined matching network, collectively referred to as dual matching network 518. Each respective matching network 518a, 518b is configured to vary an impedance between respective RF generators 512a, 512b and load or reactor 532. The impedance is tuned to adjust an impedance match between respective RF generators 512a, 512b and load 532 in order to maximize power delivered to load 532 and minimize power reflected from load 532. As will be described in greater detail herein, matching network 518a of dual matching network 518 also includes a variable reactance, indicated in FIG. 5 as variable capacitance 534. The variable reactance may be implemented as a variable capacitance or a variable inductance, and reference number 534 may refer to a variable reactance generally and a variable capacitance or variable inductance specifically, or some combination of capacitance and inductance that operates as a variable reactance. Variable capacitance may be implemented by a combination of elements that provide a capacitance, including various capacitive devices, such a variable capacitors. Variable inductance may be implemented by a combination of elements that provide an inductance, including various inductive devices, such a variable inductors. Variable capacitance 534 is configured to detect and respond to IMD products resulting from IMD between the output of RF generators 512a and 512b and, therefore, counteract the variable capacitance introduced by the variation in the surface area 328 of powered sheath 334, as described above with respect to FIG. 3.

In various embodiments, variable capacitance 534 is implemented and includes a varactor or multiple varactors configured in a varactor cell where the multiple varactors cooperate to introduce a single variable capacitance. As is well known in the art, a varactor may be referred to also as a vericap diode, varactor diode, variable capacitance diode, variable reactance diode, tuning diode, power diodes, high voltage power diodes, or other diodes that provide variable capacitance, such as when reverse biased. As is also well known in the art, a varactor is typically operated in a reverse-biased state so that no DC current flows through the device. The amount of reverse bias applied to a varactor controls the thickness of the varactor depletion zone and, therefore, the junction capacitance of the varactor. Thus, the capacitance of the varactor is inversely proportional to the reverse voltage applied to the varactor.

Figure 6:
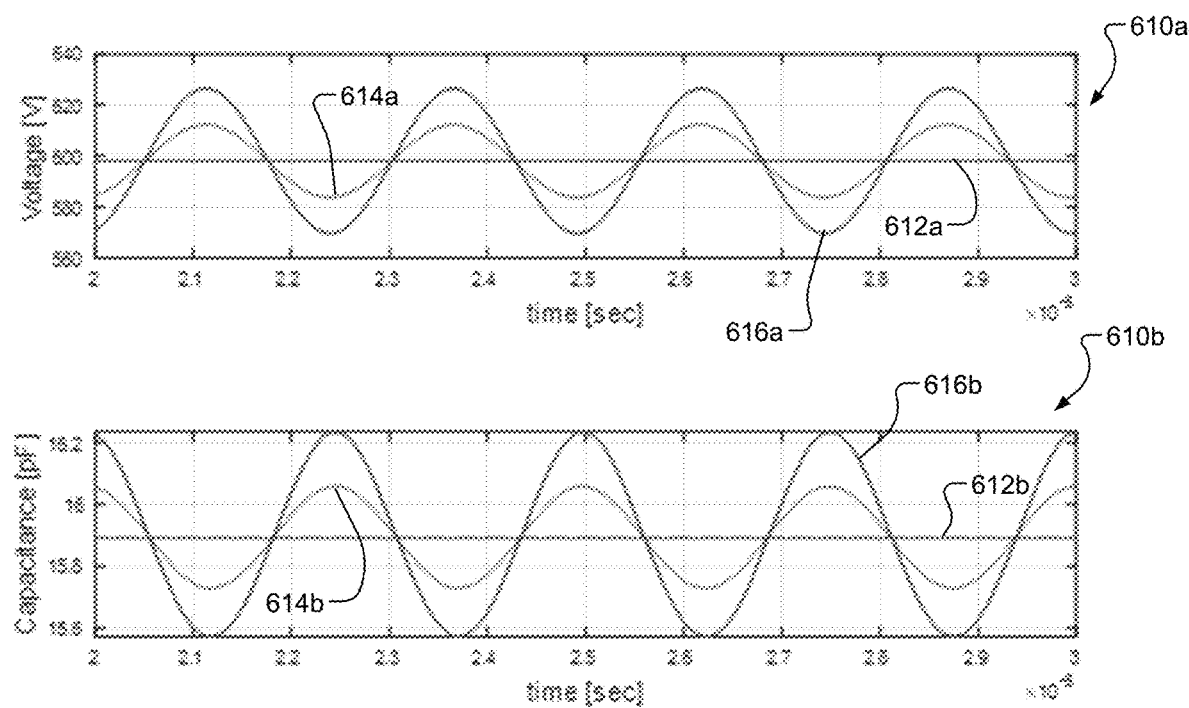
FIG. 6 shows waveforms depicting capacitance in relation to reverse bias voltage for a varactor.

FIG. 6 depicts a pair of waveforms or plots 610a, 610b which correspond to the reverse voltage applied to the varactor in waveforms 610a and the resulting capacitance across an example varactor as shown in waveforms 610b. Waveform 612a indicates a generally low amplitude reverse bias voltage applied to the example varactor. Waveform 612b indicates a corresponding capacitance varying with respect to the voltage of 612a. Since the voltage of 612a is generally constant, the capacitance of the example varactor is generally constant as shown at waveform 612b.

Waveform 614a is a sinusoidal signal indicating a periodic variation in reverse voltage applied to an example varactor. Waveform 614b indicates a corresponding capacitance variation of an exemplary varactor in response to variation in the reverse bias voltage applied in accordance with waveform 614a. As can be seen from plots 610a, 610b, as the voltage decreases in waveform 614a, the capacitance of the example varactor increases as shown at waveform 614b. Thus, the capacitance varies in inverse proportion with respect to the applied reverse voltage. Similarly, waveform 616a indicates the reverse bias voltage applied to the exemplary varactor, and waveform 616b indicates the variation in capacitance in accordance with the variation and voltage of waveform 616a. As described with respect to waveforms 614a, 614b, waveforms 616a, 616b likewise indicate an inverse proportionality between the applied reverse voltage and the capacitance of the sample varactor.

Figure 7:
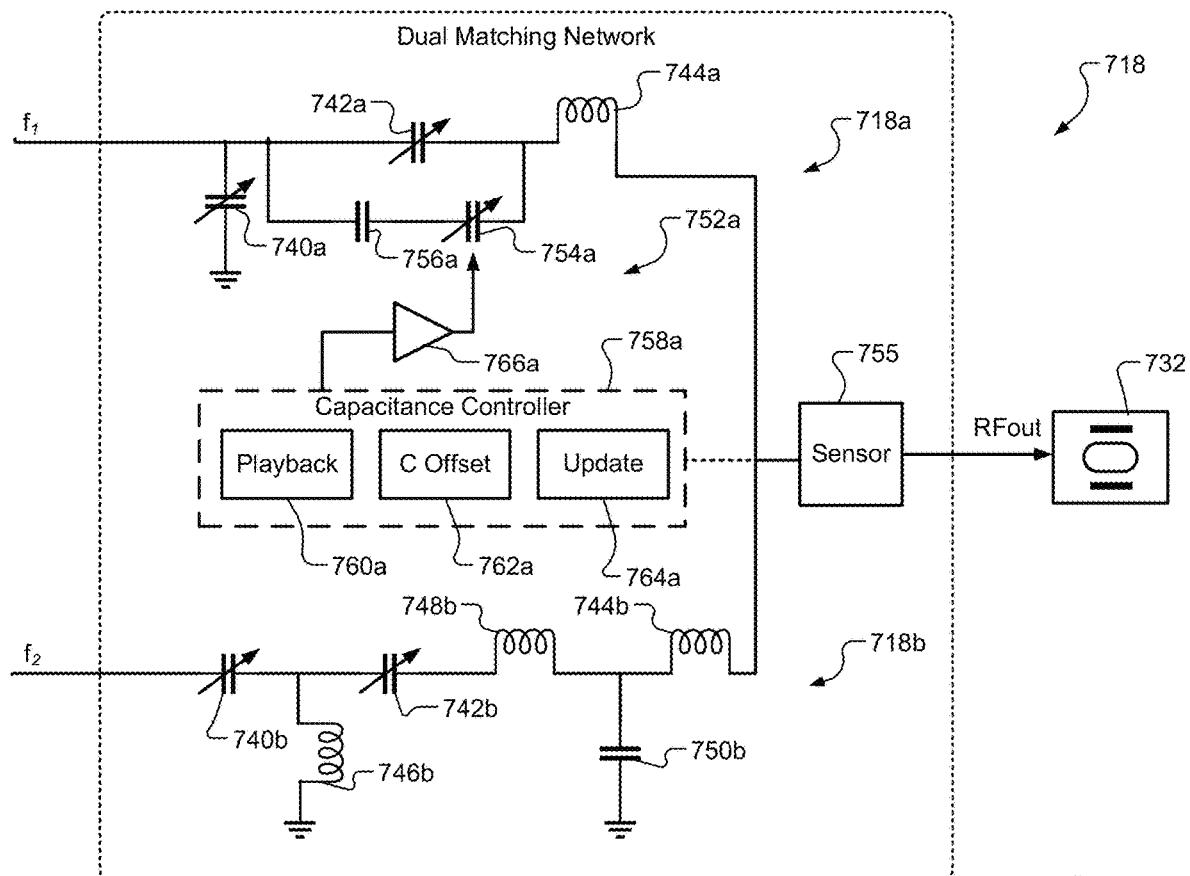
FIG. 7 is a schematic block diagram of a matching network having a variable capacitance and a control system for the variable capacitance.

FIG. 7 depicts a dual matching network 718 which generally corresponds to dual matching network 518 of FIG. 5. Dual matching network 718 is configured to compensate for sheath capacitance changes introduced by application of a low frequency signal, such as a 400 kHz signal, as described above with respect to FIGS. 3 and 4. Whereas a conventional matching network is configured to tune to a predetermined impedance, the dual matching network 718 of FIG. 7 not only tunes to a predetermined impedance but also compensates for sheath capacitance changes.

In various embodiments, as will be described in greater detail herein, a series capacitor operates at the same frequency as the sheath modulation (that is, the frequency of the RF bias source) so that the capacitance changes to compensate for sheath capacitance changes. By way of non-limiting example, when the sheath capacitance decreases by a predetermined value ΔC, the series capacitance is decreased by the same corresponding value Δc, so that the total capacitance of the sheath capacitor, such as occurring at wide sheath 330 of FIG. 3, and the series capacitor is kept constant. By compensating for the sheath capacitance changes, IMD can be effectively reduced or cancelled, thereby reducing or cancelling reverse power resulting from IMD. In various embodiments, the capacitance is varied by varying the reverse bias of a varactor or a varactor cell.

With further reference to FIG. 7, conventional matching networks typically consist of two vacuum variable capacitors (VVC) driven by respective stepper motors. The speed of a stepper motor is in the range of a few hundred RPM, while a typical operating frequency of a bias RF power supply may be around 400 kHz. Thus, a stepper motor controlling a VVC cannot operate at a sufficient frequency. In various embodiments, therefore, variable capacitance is provided using an electronic variable capacitor (eVC) which has a capacitance that can vary at a greater rate than a VVC. In various embodiments, the dual matching network described herein implements a variable reactance such as described above with respect to reference number 534 of FIG. 5, to compensate for the change in sheath capacitance Δc. In various embodiments, the variable reactance can be introduced using a variable capacitance, such as a varactor, variable inductors, switch capacitance arrays, switch inductor arrays, saturable inductors, and the like. In various embodiments, switch capacitor arrays can be on and off or operating at low frequency, such as the operating frequency of a bias power supply, and provide capacitance at discrete values.

With further reference to FIG. 7, first variable reactance section or first matching network 718a is configured to include a variable reactance, such as variable capacitance 534 of FIG. 5, and is connected to a source RF power supply applying RF power at a frequency $f_1$. A second variable reactance section or second matching network 718b corresponds to matching network 518b of FIG. 5 and receives an RF input, such as a bias RF signal having a frequency $f_2$. Matching network 718 outputs an RF signal combining respective source RF signal $f_1$ and bias RF signal $f_2$ to a non-linear load or plasma chamber or reactor 732. Each matching network 718a, 718b includes respective load capacitors 740a, 740b, tune capacitors 742a, 742b, and output inductors 744a, 744b. It will be recognized by one skilled in the art that load capacitor 740b is configured in parallel, similarly to load capacitor 740a, with load 732, via inductor 746b. Load capacitors 740a, 740b, and tune capacitors 742a, 742b are operated as conventional load and tune capacitors, as is well known to those skilled in the art. Load capacitors 740a, 740b and tune capacitors 742a, 742b are in various embodiments VVCs, but can be implemented using eVCs. Further, it will be recognized that load capacitors 740a, 740b and tune capacitors 742a, 742b can be replaced with other variable reactance tuning elements, circuits, and/or networks. Matching network 718b also includes a capacitor 750b connected at one terminal to inductors 748b, 744b and at another terminal to ground. Capacitor 750b functions as a low pass filter and rejects high frequency components from the source power supply that outputs source RF signal $f_1$.

Dual matching network 718a also includes a third variable reactance section or variable capacitance circuit 752a for reacting to the sheath capacitance changes ΔC. The variable reactance or variable capacitance circuit 752a includes a variable capacitor 754a, which may be implemented as a varactor or other variable capacitance element, as described above. Variable capacitance circuit 752a also includes a capacitor 756a. Capacitor 756a drops the voltage in variable capacitance circuit 752a.

Variable capacitance circuit 752a is controlled via a capacitance controller 758a having a playback module 760a, an offset module 762a, and an update module 764a. Capacitance controller detects the application of the RF bias signal $f_2$ and generates a control signal to vary the capacitance of variable capacitance 754a in order to minimize IMD resulting from the application of RF bias signal $f_2$. Capacitance controller 758a generates an input control signal to amplifier 766a. Amplifier 766a is typically implemented as generating a (reverse) bias voltage of sufficient value to control the capacitance across variable capacitor 754a in order to cancel IMD resulting from changes in the plasma sheath, such as powered sheath 334 of FIG. 3. In various embodiments, amplifier 766a is a high voltage amplifier driving varactors which implement variable capacitance circuit 752a, as will be described further herein.

In various embodiments, capacitance controller 758a varies both the phase and magnitude of a periodic control signal applied to amplifier 766a. Varying the phase and magnitude of a periodic signal changes the source of the control signal input to variable capacitor 754a to cancel the sheath capacitance which varies in accordance with the output of the bias or second RF power supply. Varying the magnitude of the control signal input to amplifier 766a correspondingly varies the reverse bias voltage applied to variable capacitor 754a in order to vary the change in capacitance $\Delta C_{eVC}$ in order to match the sheath capacitance $\Delta C_{sheath}$. Capacitance controller 758a also varies the phase of $\Delta C_{eVC}$ to correspondingly match the phase of the bias RF signal $f_2$. In various embodiments, capacitance controller 758a may be implemented as an open loop or closed loop controller. In a closed loop mode of operation, the RF bias voltage $f_2$ can be sensed in order to vary the phase of the control signal applied to amplifier 766a. Capacitance controller 758a receives a signal from matching network sensor 755. Matching network sensor 755 operates similarly as described with respect to sensors 516a, 516b. Sensor 755 generates an output signal to capacitance controller 758a and other control components (not shown) of dual matching network 718.

As described above, capacitance controller 758a includes playback module 760a, capacitance offset module 762a, and update module 764a. Each module 760a, 762a, 764a can be implemented collectively or individually as a process, a processor, a module, or a submodule. Further, each module 760a, 762a, 764a can be implemented as any of the various components described below in connection with the term module. Playback module 760a monitors for a triggering event or signal with which to synchronize the application of reactance, or capacitance or inductance, offset or adjustment to matching network 718a. Once playback module 760a detects a triggering event or signal, playback module 760a initiates the adjustment of reactance or capacitance to variable capacitor or reactance 754a. Playback module 760a cooperates with respective capacitance adjustment or offset module 762a. Reactance or capacitance adjustment module 762a and provides capacitance adjustments to update module 764a, which coordinates the application of respective capacitance adjustment or offset to variable capacitance 754a.

In various embodiments, capacitance adjust module 762a may be implemented as a lookup table (LUT). The respective reactance or capacitance adjustment (both amplitude and phase) are determined in accordance with, for example, a timing or synchronization relative to a triggering event or signal. Given the periodic nature of bias RF signal $f_2$ and the expected IMD that occurs in response to application of RF signal $f_2$ to load 732, a LUT of the adjustments or offsets for the capacitance of variable capacitance 754a can be determined.

The capacitance adjustments are generated to align with the dynamic impact on load 732 introduced by generator 512b and one or both improves the efficiency of operation of load 732 and at least partially cancels the bias IMD, thereby reducing impedance fluctuations. In various embodiments, the LUT can be statically determined by experimentation, or automatically adjusted with an update process, such as with update module 764a. In various other embodiments, the capacitance adjustments can be determined dynamically.

Figure 8:
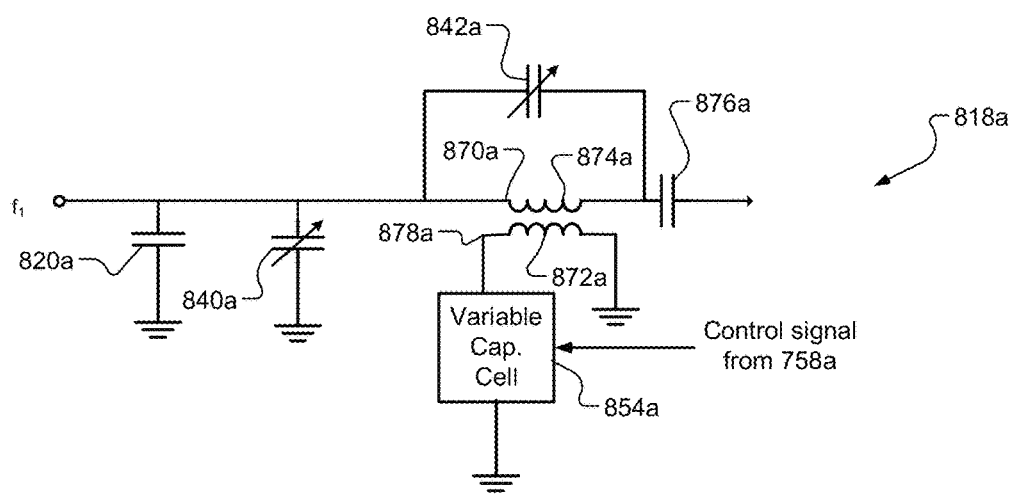
FIG. 8 is a schematic diagram of a portion of a matching network including an isolation circuit.

FIG. 8 depicts a various embodiment of a matching network 818a corresponding to matching network 518a of FIG. 5 or matching network 718a of FIG. 7. Matching network 818a is configured so that the variable capacitance is isolated from the higher power RF signal $f_1$ and the load, such as load 532 of FIG. 5 or load 732 of FIG. 7. Matching network 818a includes an input capacitor 820a, a load capacitor 840a, and a tune capacitor 842a. Matching network 818a also includes a variable capacitance cell 854a which may be implemented as a varactor or the various varactor alternatives described above. Further, variable capacitance cell 854a can be implemented as a variable reactance that can be varied in accordance with the variation in the sheath capacitance. Matching network 818a also includes a transformer 870a having an input winding 872a and an output winding 874a. Output winding 874a is arranged in series between an input of source RF signal $f_1$, blocking capacitor 876a, and the load, such as load 532 of FIG. 5 or load 732 of FIG. 7. Input winding 872a of transformer 870a has a first terminal connected to ground, and a second terminal connected to tune capacitor 842a and variable capacitance cell 854a. Thus, variable capacitance cell 854a is in parallel and electrically in series between the input to matching network 818a receiving source RF signal $f_1$, blocking capacitor 876a, and the load. One terminal of input to winding 872a defines a node 878a at which the terminals of respective tune capacitor 842a and variable capacitance cell 854a connect opposite from ground reference. In various embodiments, tune capacitor 842a can be isolated similarly to variable capacitance cell 854a by placing tune capacitor 842a between ground and a terminal of input winding 872a connected to variable capacitance cell 854a.

Figure 9:
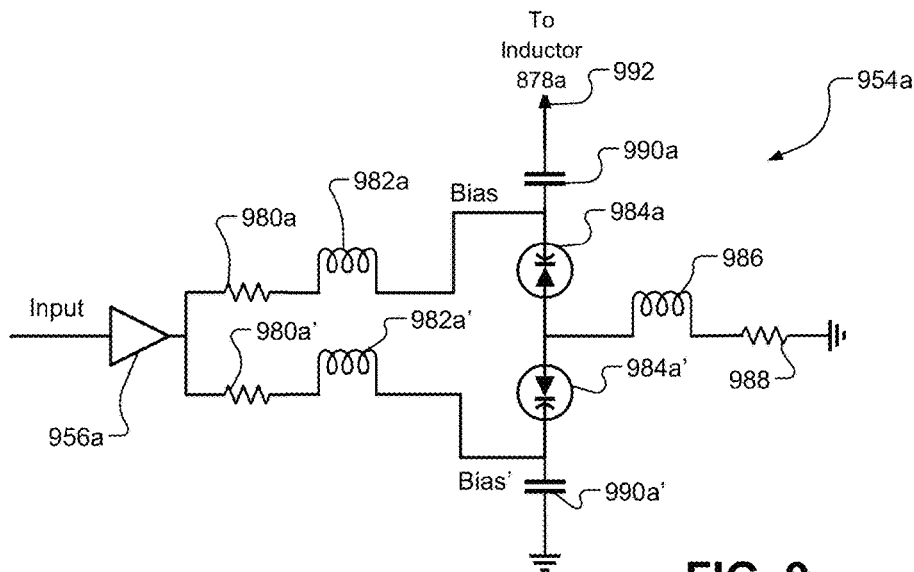
FIG. 9 is a schematic of a back-to-back diode varactor with anode connected diodes and a drive circuit according to various embodiments of the present disclosure.

FIG. 9 depicts a variable capacitance cell 954a corresponding to variable capacitance cell 854a of FIG. 8. Variable capacitance cell 954a includes an amplifier 956a which receives a control signal, such as from capacitance controller 758a of FIG. 7. Amplifier 956a amplifies a control signal and generates an output signal to respective resistors 980a, 980a'. The output from resistors from 980a, 980a' is input to respective inductors 982a, 982a'. Inductors 982a, 982a' output respective bias signals to a respective pair of anode-connected varactors 984a, 984a'. While items 984a, 984a' are depicted as varactors, one skilled in the art will recognize that the various varactor alternatives described above may be substituted therefor. As described above, varactors 984a, 984a' present a capacitance to the circuit that varies inversely with respect to the magnitude of a reverse bias signal. Inductors 982a, 982a' output respective reverse bias signals Bias a, Bias a', thereby providing a pair of reverse bias signals to respective varactors 984a, 984a'. The anodes of respective varactor diodes 984a, 984a' are connected and also connect to an inductor 986 in series with an output resistor 988. The cathodes of respective varactor diodes 984a, 984a' connect to respective DC blocking capacitors 990a, 990a'. Blocking capacitor 990a' connects to ground. Blocking capacitor 990a connects to node 990, connects to node 878a of FIG. 8. In various configurations, varactors 984a, 984a' may be replaced with pin diodes. In various other configurations, varactors 984a, 984a' and inductor 986 may be replaced with a pin diode switched capacitor configuration to provide a variable reactance.

Figure 10:
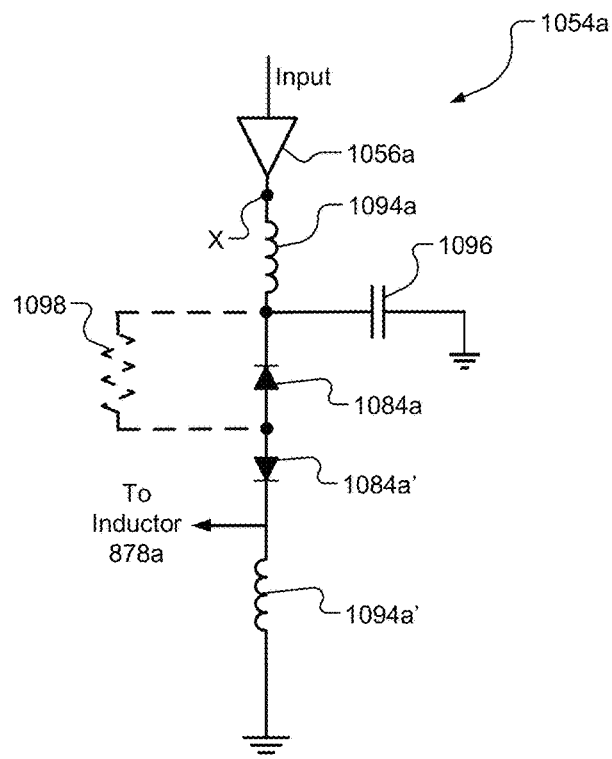
FIG. 10 is a schematic of a back-to-back diode varactor with anode connected diodes according to various embodiments of the present disclosure.

FIG. 10 depicts a various embodiment for variable capacitance cell 854a of FIG. 8. In the various capacitance cell 1054a, the control input, such as from capacitance controller 758a of FIG. 7 is input to amplifier 1056a which amplifies the input signal to provide a reverse bias signal to respective varactor diodes 1084a, 1084a'.

In FIG. 10, a variable capacitance cell 1054a having back-to-back diode varactor that includes a pair of varactor diodes 1084a, 1084a', inductors 1094a, 1094a' and capacitor 1096. Inductors 1094a, 1094a' are connected in series with the cathodes of varactor diodes 1084a, 1084a'. Anodes of varactor diodes 1084a, 1084a' are connected to each other. An RF input signal is received at a terminal X from amplifier 1056a connected to inductor 1094a'. Capacitor 1096 is a bypass capacitor that permits passage of RF power and is connected (i) at a first end to the inductor 1094a and a cathode of the diode 1084a, and (ii) at a second end to ground. Inductors 1094a, 1094a' may be referred to as RF chokes because inductors 1094a, 1094a' prevent passage of RF power. A bleeder resistor 1098 may be connected in parallel with varactor diode 1084a to allow for faster changes in the bias voltage. Resistor 1098 may also be connected between varactor diodes 1084a, 1084a' and ground.

Figure 11:
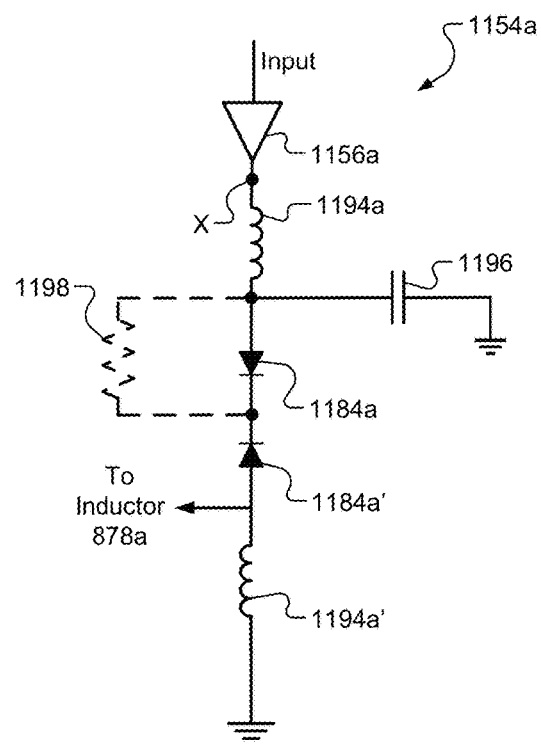
FIG. 11 is a schematic of a back-to-back diode varactor with cathode connected diodes according to various embodiments of the present disclosure.

The back-to-back diode varactor of FIG. 10 may be connected in parallel with the capacitor 842a of FIG. 8 at node 878a and, thus, in series between the RF source input $f_1$ and a load such as load 532 of FIG. 5 or load 732 of FIG. 8. Although FIG. 10 shows the diodes 1084a, 1084a' connected anode-to-anode, the diodes may be connected cathode-to-cathode, where the respective anodes of the diodes 1184a, 1184a' of FIG. 11 are connected to (i) the inductor 1194a and the capacitor 1196, and (ii) the RF input terminal x and the inductor 1194a'. This is shown in FIG. 11.

Figure 12:
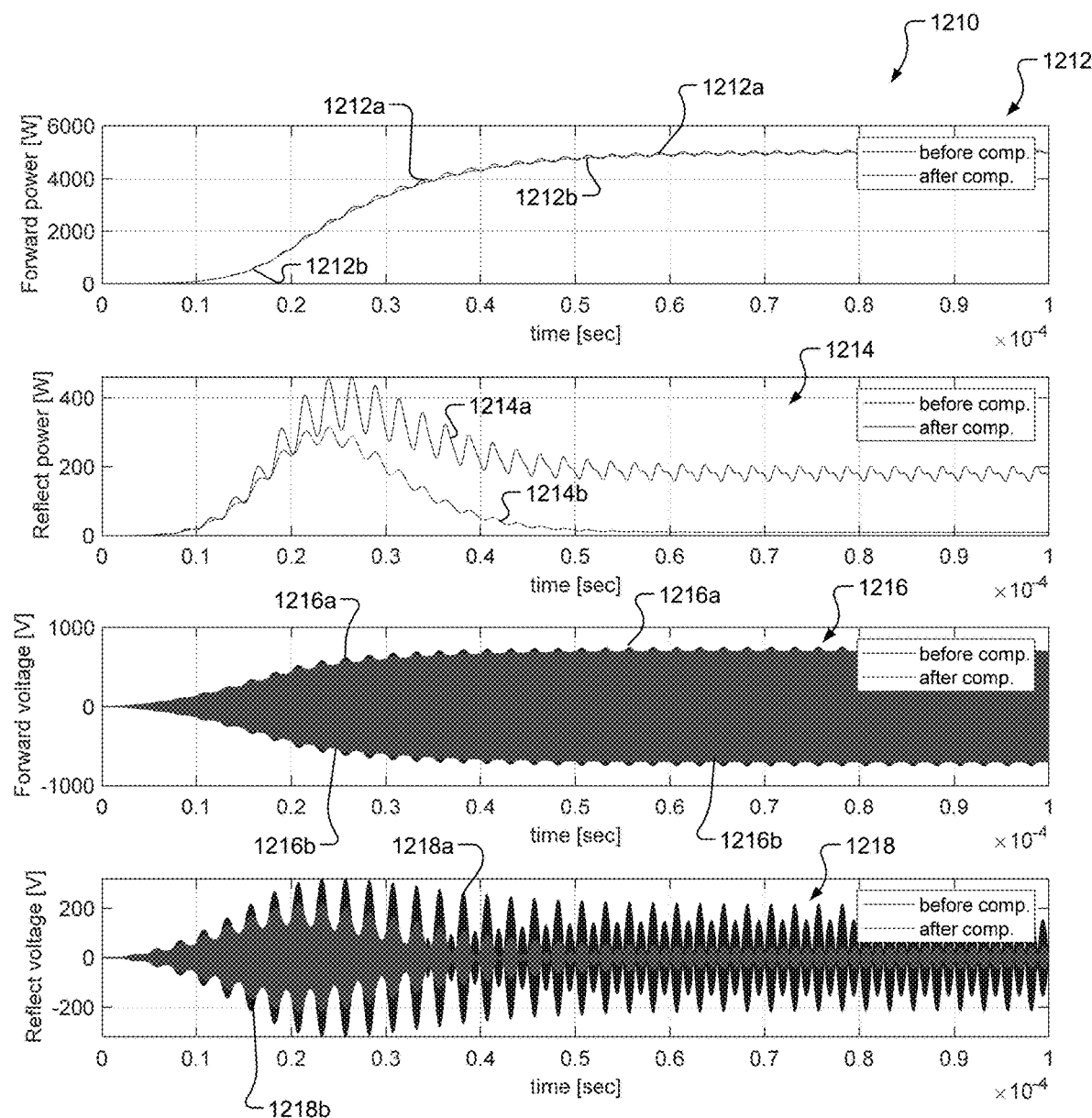
FIG. 12 depicts waveforms in the time domain describing operation of the power supply system according to various embodiments of the present disclosure.

FIG. 12 depicts waveforms 1210 that provide a comparison of operation of a system using conventional matching network approaches and versus a system using conventional match or matching network approaches and also applying a variable capacitance adjusting in accordance with the change in sheath capacitance as described above. Waveforms 1212 depict a pair of forward power waveforms showing the forward power at the source RF power generator when using a conventional matching network approach, indicated by waveform 1212a, and a conventional matching network approach in combination with the variable reactance or capacitance approach to IMD mitigation described above, shown at waveform 1212b. While the waveforms may appear somewhat similar, one skilled in the art will recognize that the mildly sinusoidal appearance of waveform 1212a indicates variation in application of the forward power. Such variation can cause inconsistency in reactors requiring a reliable, consistent, smooth application of forward power.

Waveforms 1214 depict reflected power as detected at the source RF generator, such as RF generator 512a of FIG. 5 or an RF generator, not shown in FIG. 7. Waveform 1214a depicts reflected power measured at the source RF generator when using conventional matching network approaches. By comparison, waveform 1214b depicts reflected power detected at the source RF generator when using conventional matching network approaches and a variable reactance or capacitance approach to IMD mitigation described above. As can be seen in waveforms 1214, reflected power is significantly reduced in waveform 1214b.

Waveforms 1216 indicate the forward voltage detected at the output of the source RF generator. Waveform 1216a depicts the forward voltage detected at the source RF generator when using conventional matching network approaches. Waveform 1216b depicts forward voltage detected at the source RF generator when using conventional matching network approaches and a variable reactance or capacitance approach to IMD mitigation described above. Similar to forward power waveforms 1212, as can be seen at waveforms 1216, forward voltage 1216a has an oscillating component when using conventional matching network techniques. Forward voltage waveforms 1216b, on the other hand, exhibit a generally smooth application of forward power.

Waveforms 1218a depict reflected voltage detected at the source RF generator. As can be seen in waveforms 1218, waveform 1218a depicts the reflected power at the source RF generator when using conventional matching network techniques, and waveform 1218b depicts reflected power when using conventional matching network approaches and a variable reactance or capacitance approach to IMD mitigation described above. As can be seen at waveform 1218a, conventional matching network approaches and a variable reactance or capacitance approach to IMD mitigation described above significantly reduces the reflected voltage detected at the source RF generator.

Figure 13:
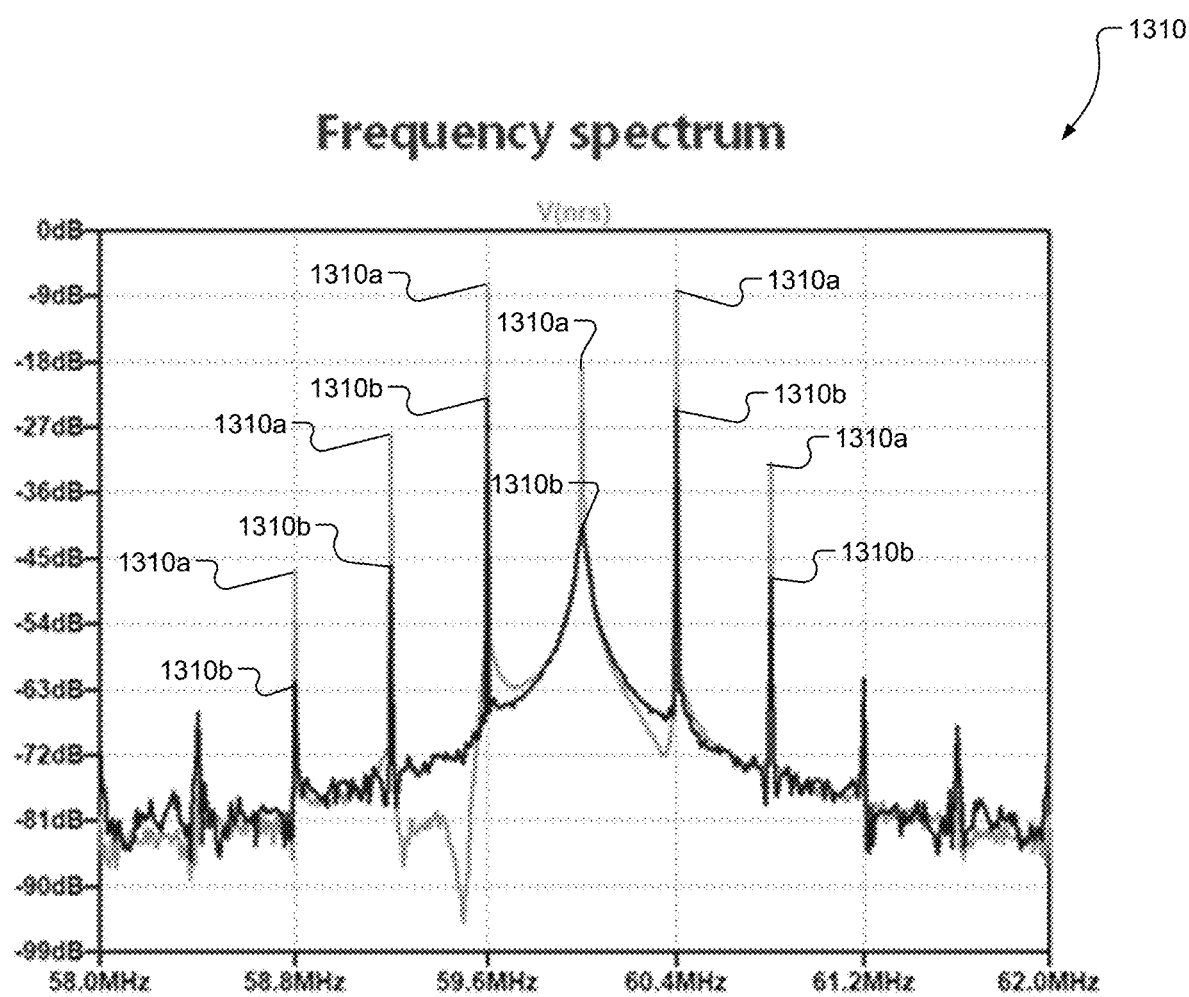
FIG. 13 depicts waveforms in the frequency domain describing operation of the power supply system according to various embodiments of the present disclosure.

FIG. 13 depicts waveforms 1310 making selected, similar comparisons as in FIG. 12, but described in the frequency domain. Accordingly, waveforms 1310 are a plot of power in decibels with respect to the frequency of the RF source generator. Peaks 1310a are example peaks of the reverse power waveform at various frequencies. Similarly, peaks 1310b are example peaks of the reverse power waveforms of the reverse power waveform at various frequencies. As can be seen in FIG. 13, the reverse power peaks 1310b are significantly reduced using the techniques disclosed herein. Reverse voltage peaks 1310a depict the reverse voltage using conventional matching network techniques, while reverse voltage peaks 1310b depict reverse power using conventional matching network approaches and a variable reactance or capacitance approach to IMD mitigation described above.

Figure 14:
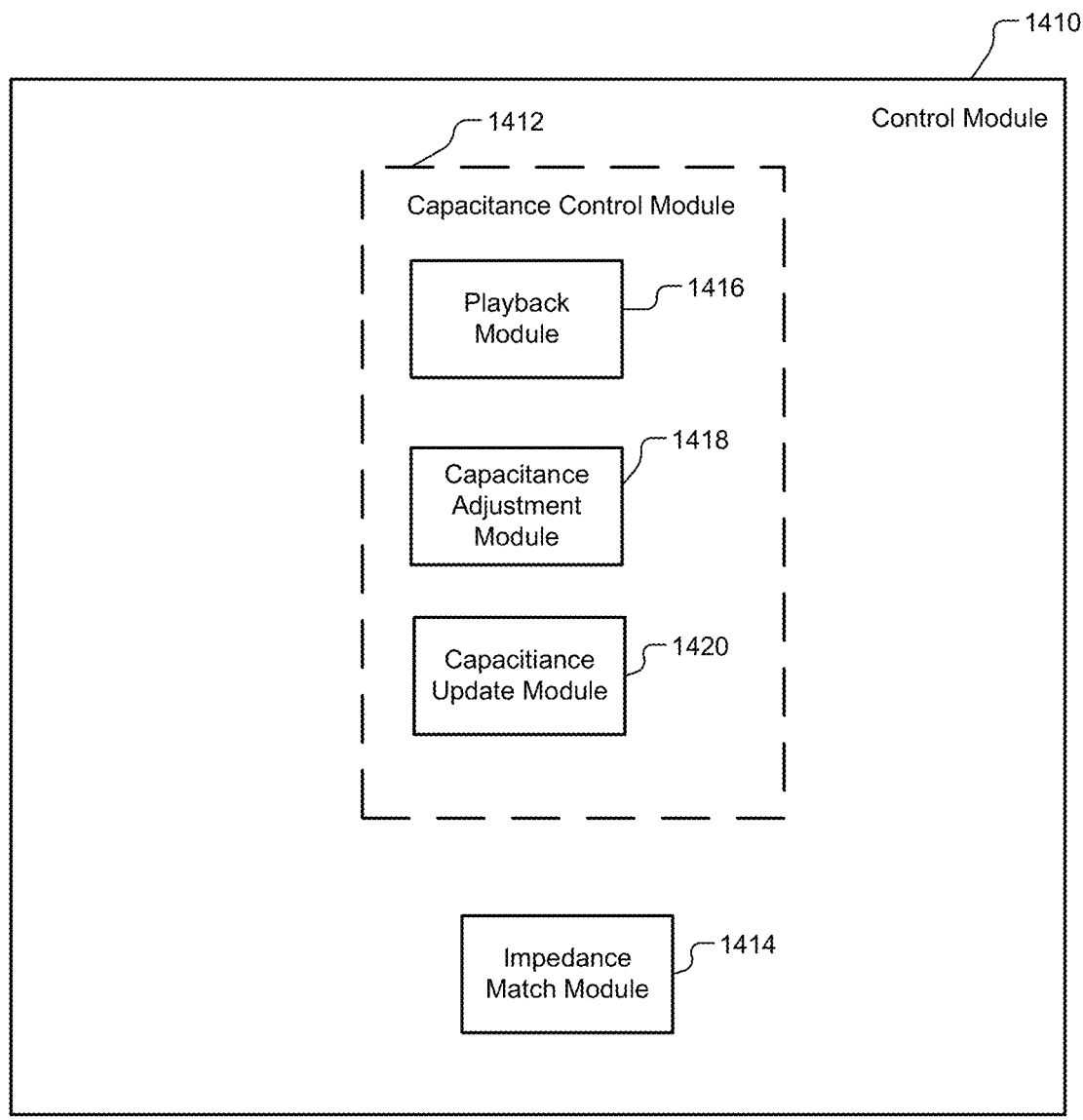
FIG. 14 is a functional block diagram of an example control module according to various embodiments of the present disclosure.

FIG. 14 shows a control module 1410. Control module 1410 incorporates various components of FIGS. 3, 5, and 7. Control module 1410 may include capacitance control module 1410 and impedance match module 1414. Capacitance control module 1412 may include submodules, including playback module 1416, capacitance adjustment module 1418, and capacitance update module 1420. In various embodiments, control module 1412 includes one or a plurality of processors that execute code associated with the modules 1412, 1414, 1416, 1418, and 1420. Operation of the modules 1412, 1414, 1416, 1418, and 1420 is described below with respect to the method of FIGS. 14-15.

Figure 15:
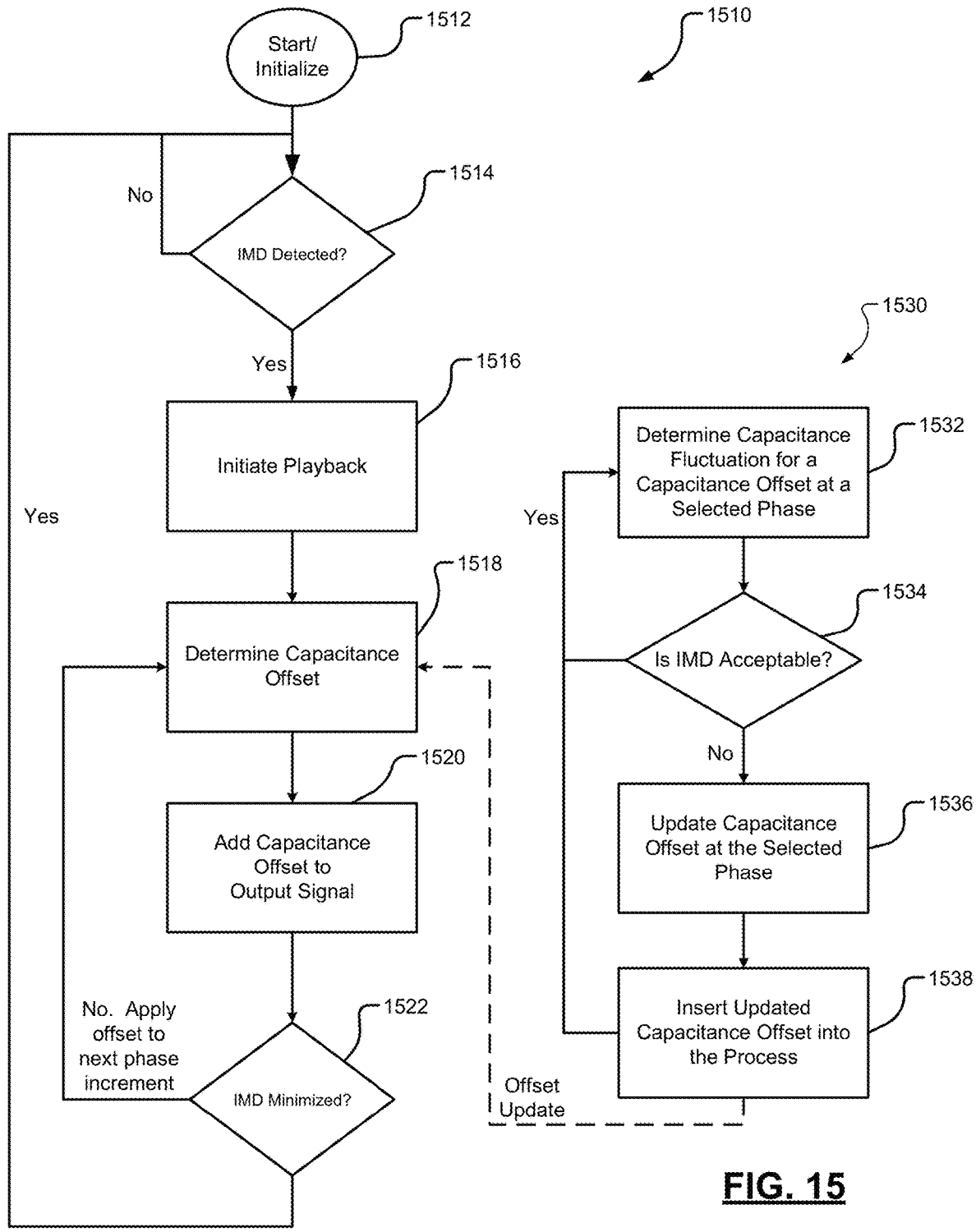
FIG. 15 is a flowchart for controlling the variable capacitance in response to intermodulation distortion (IMD) in according to various embodiments of the present disclosure.

For further defined structure of controller 758a of FIGS. 7 and 14, see the below provided method of FIG. 15 and the below provided definition for the term "module". The systems disclosed herein may be operated using numerous methods, an example control system method of which is illustrated in FIG. 15. Although the following operations are primarily described with respect to the implementations of FIGS. 7 and 14, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 15 depicts a flow diagram of the bias cancellation method 1510 described in the present disclosure. Control begins at block 1512 in which various parameters are initialized. Control proceeds to block 1514 which monitors for a trigger event. As will be described in greater detail herein, a trigger event can be any event which indicates the presence of IMD in RF signal $f_1$ output by RF generator 512a. Block 1514 continues to monitor whether a trigger event has occurred and loops back in a wait state until such an event has occurred. Upon detection of a trigger event, control proceeds to block 1516 which initiates playback of a capacitance offset sequence synchronized to the occurrence of the triggering event.

Once playback is initiated, control proceeds to block 1518. At block 1518, capacitance adjustments are determined relative to the trigger event. The capacitance offsets are in various embodiments determined in accordance with an expected sheath capacitance fluctuation referenced to an event, such as sequencing of an RF signal output from bias RF generator 512b. Once the capacitance offset is determined, typically in relation to the trigger event, control proceeds to block 1520 in which the capacitance offset is added to the RF signal output from RF generators 512a using the variable capacitance or reactance described above. The capacitance offset or adjustment includes at least one of a magnitude or phase adjustment to adjust the variable capacitance. The adjustment is configured to track the changes in sheath capacitance $\Delta C$. Control proceeds to block 1522 which determines if the playback sequence has completed. That is, at decision block 1522, if the playback sequence is completed, control proceeds to decision block 1514 where monitoring for a trigger event continues. If the playback sequence is not completed, control proceeds to block 1518 where the capacitance offset is determined.

Also shown in FIG. 15 is a flow diagram 1530 for updating the capacitance offsets of block 1518. Flow diagram 1530 may be implemented by update module 764a of controller 758a. In flow diagram 1530, control commences at block 1532 which detects IMD at a selected phase relative to, for example, the trigger event. Control proceeds to decision block 1534 which determines whether the IMD is acceptable. That is, at decision block 1534, the IMD at source RF generator 512a is compared to a threshold to determine if the IMD is acceptable or within a threshold for a given capacitance offset. If the IMD is acceptable, control proceeds to block 1532. If the IMD is outside a predetermined range or threshold, control proceeds to block 1536 which updates the capacitance offset at the selected phase in order to reduce IMD. Once the capacitance offset at the selected phase is determined, control proceeds to block 1538 which proceeds to insert the updated capacitance offset into block 1518 which determines the capacitance offset.

In various embodiments the trigger event, such as discussed with respect to block 1514, is intended to synchronize capacitance controller 758a with source RF generator 512a so that capacitance offsets can be appropriately applied relative to the bias RF signal, thereby minimizing IMD. Synchronization between capacitance controller 758a, RF generator 512b can occur by detecting IMD at load 732. IMD may be detected by using a sensor present in a self matching network.

Synchronization can be achieved by analyzing the IMD and phase-locking to a signal indicating the IMD. For example, by analyzing signals X, Y output from sensor 755 of FIG. 7, a signal indicating the impedance fluctuations can be generated. In this configuration, capacitance controller 758a can effectively work as a standalone unit without an external control connection.

The trigger events described in the various embodiments above are typically related to a periodicity of the trigger event. For example, IMD may repeat periodically in accordance with the RF signal output from RF generator 512b. Similarly, the above-discussed signal indicating IMD may also have a periodicity to it. Other triggering events need not be periodic. In various embodiments, a triggering event can be a non-periodic, asynchronous event, such as an arc detected within plasma chamber 732.

In various embodiments, capacitance offset module 762a and corresponding block 1518, in which the capacitance offset is determined, can be implemented in a lookup table (LUT). The LUT can be statically determined by obtaining empirical data relating capacitance fluctuations relative to the bias RF signal output from RF generator 512b and applied to plasma chamber 732. When the LUT is determined statically, flow diagram 1530 of FIG. 15 may not be applicable. In other in various embodiments, LUT can be determined dynamically as described with respect to flow diagram 1530.

In various embodiments, the capacitance offsets can be applied in equal increments relative to the RF signal output by bias RF generator 512b, providing a consistent resolution over the range of capacitance offsets. In various other embodiments, the resolution of the capacitance offsets can vary. That is, the capacitance offsets can be variably spaced in time so that more offsets may be applied for a given duration of the bias RF output signal, and fewer offsets may be applied for the same duration in a different portion of the bias RF output signal. The state-based approach herein thus increases resolution of the capacitance offsets where necessary, such as when IMD is more unstable for a given period, and decreases resolution of the capacitance offsets where appropriate, such as where the IMD is more stable for a given period. A state-based approach can provide a more efficient implementation by reducing computational or processing overhead where appropriate. In various embodiments, the magnitude of each offset can vary.

In various other embodiments, feedback control loop within capacitance controller 758a can provide information for applying the offset capacitances and can apply capacitances dynamically, without reference to predetermined offsets. In order to implement such a system, existing capacitance tuning methods, such as servo-based tuning or dynamic IMD information, are utilized. This IMD information can be used to prospectively adjust the capacitance offset in order to correspondingly reduce the sheath capacitance fluctuations.

In various embodiments, the RF signal or envelope is pulsed with multiple pulse states (1 . . . n), the variable reactance control approach described herein can be applied to the multiple pulse states. When a given pulse state, j, terminates, the relevant state variables adjusting the variable capacitance are saved and subsequently restored when state j resumes. An example of such a multiple pulse state system can be found with respect to U.S. Pat. No. 8,952,765 assigned to the assignee of the patent application and incorporated by reference in its entirety in this application.

In various embodiments, where the pulsed RF signal or envelope is modulated in a repeating pattern, the RF envelope can be divided into p time segments or "bins". The variable reactance control approach described herein can be applied to each time segment. An example of such a system can be found with reference to U.S. Pat. Nos. 10,049,357 and 10,217,609, both assigned to the assignee of the patent application and incorporated by reference in their entirety in this application.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A matching network comprising:
   a first reactance section configured to provide a first reactance to control an impedance between a first RF power source generating a first RF signal operating at a first frequency and a load; and
   a second variable reactance section configured to adjust a second reactance to control impedance in response to intermodulation distortion (IMD) from interaction between the first RF signal and a second RF signal on the impedance.

2. The matching network of claim 1 further comprising a capacitance controller comprising:
   a playback module configured to respond to a trigger signal, the trigger signal varying in accordance with the IMD, the playback module further configured to control the second variable reactance section in response to the trigger signal; and
   a reactance adjustment module configured to determine an adjustment to the second variable reactance section.

3. The matching network of claim 1 wherein the IMD varies in accordance with a position of a plasma sheath relative to an electrode of the load, and the impedance varies in accordance with the IMD.

4. The matching network of claim 1 wherein the second reactance includes at least one of a capacitance or an inductance and the at least one of the capacitance or the inductance is varied in accordance with controlling at least one of a diode or a varactor.

5. The matching network of claim 4 wherein the at least one of the diode or the varactor is controlled in accordance with a bias voltage applied to a terminal of the at least one of the diode or the varactor.

6. The matching network of claim 5 wherein the second variable reactance section includes a controller configured to output a control signal, the control signal varying the bias voltage of the at least one of the diode or the varactor.

7. The matching network of claim 5 wherein the second variable reactance section includes a controller configured to output a control signal that varies the bias voltage applied to the at least one of a diode or a varactor.

8. The matching network of claim 1 further comprising:
a third reactance section configured to provide a third reactance to control impedance between the a second RF power source generating the second RF signal at a second frequency and the load.

9. The matching network of claim 8 wherein the first frequency is greater than the second frequency and the second variable reactance section is configured to electrically communicate with the first reactance section.

10. The matching network of claim 9 wherein the third reactance section further comprises a third variable reactance configured to control the impedance between the second RF power source and the load.

11. The matching network of claim 10 wherein the first frequency is greater than the second frequency and the second variable reactance section is configured to electrically communicate with the first reactance section.

12. The matching network of claim 1 wherein the first reactance section further comprises a first variable reactance configured to control the impedance between the first RF power source and the load.

13. A radio frequency (RF) power supply system comprising:
a RF power source; and
matching network between the RF power source a load, inducing:
a first reactance section configured to provide a first reactance to control an impedance between a first RF power source generating a first RF signal operating at a first frequency and the load, wherein the first reactance is one of fixed or variable; and
a second variable reactance section configured to adjust a second reactance to introduce a reactance offset to control impedance in response to intermodulation distortion (IMD) from interaction between the first RF signal and a second RF signal operating at a second frequency on the impedance; and
a controller configured to communicate with the second variable reactance section and configured to generate a control signal to adjust the second reactance in response to a trigger signal to control the impedance, wherein the reactance offset varies in accordance with the second RF signal.

14. The RF power supply system of claim 13, wherein the first RF signal is a source RF signal applied to the load and the second RF signal is a bias RF signal applied to the load, and the load is a plasma chamber.

15. The RF power supply system of claim 13, wherein the reactance offset varies in accordance with a timing that varies in accordance with the trigger signal, wherein the trigger signal indicates a position of the second RF signal relative to the first RF signal.

16. The RF power supply system of claim 13, wherein the controller is configured to retrieve the reactance offset from memory or to calculate the reactance offset.

17. The RF power supply system of claim 13, wherein the reactance offset includes a plurality of reactances output in a predetermined order and timing in accordance with the trigger signal.

18. The RF power supply system of claim 13, wherein the controller is configured to update the reactance offset in accordance with the second RF signal.

19. The RF power supply system of claim 13, wherein the reactance offset varies in accordance with an intermodulation distortion caused by the second RF signal.

20. The RF power supply system of claim 13, wherein the first frequency is greater than the second frequency.

21. The RF power supply system of claim 13, wherein the controller further comprises a playback module, the playback module configured to detect the trigger signal, the playback module configured to initiate introduction of the reactance offset to RF output.

22. The RF power supply system of claim 21, wherein the controller further comprises a lookup table, the lookup table configured to store the reactance offset introduced by the playback module.

23. The RF power supply system of claim 22, wherein the controller further comprises an update module, the update module configured to update the reactance offset in accordance with an electrical characteristic of the first RF signal.

* * * * *